US012768919B2

(12) United States Patent
Grodzki et al.

(10) Patent No.: US 12,768,919 B2
(45) Date of Patent: Oct. 20, 2026

(54) METHOD FOR ADAPTING A MAGNETIC RESONANCE SEQUENCE, MAGNETIC RESONANCE APPARATUS, AND COMPUTER PROGRAM PRODUCT

(71) Applicant: Siemens Healthineers AG, Forchheim (DE)

(72) Inventors: David Grodzki, Erlangen (DE); Nicolas Gross-Weege, Nuremberg (DE)

(73) Assignee: Siemens Healthineers AG, Forchheim (DE)

( * ) Notice: Subject to any disclaimer, the term of this patent is extended or adjusted under 35 U.S.C. 154(b) by 160 days.

(21) Appl. No.: 18/774,668

(22) Filed: Jul. 16, 2024

(65) Prior Publication Data

US 2025/0028013 A1 Jan. 23, 2025

(30) Foreign Application Priority Data

Jul. 19, 2023 (DE) ..................... 10 2023 206 857.5

(51) Int. Cl.
*G01V 3/00* (2006.01)
*G01R 33/36* (2006.01)
(Continued)

(52) U.S. Cl.
CPC ....... *G01R 33/443* (2013.01); *G01R 33/3607* (2013.01); *G01R 33/385* (2013.01)

(58) Field of Classification Search
CPC . G01R 33/443; G01R 33/3607; G01R 33/385
(Continued)

(56) References Cited

U.S. PATENT DOCUMENTS

2019/0064293 A1 2/2019 Zhang et al.

FOREIGN PATENT DOCUMENTS

CN 101114013 B * 8/2012 ............ G01R 33/54
CN 112450912 A * 3/2021 ............ A61B 5/055
(Continued)

OTHER PUBLICATIONS

Hargreaves, Brian A., et al., "Variable-Rate Selective Excitation for Rapid MRI Sequences," Magnetic Resonance in Medicine, vol. 52, pp. 590-597 (2004).
(Continued)

*Primary Examiner* — Walter L Lindsay, Jr.
*Assistant Examiner* — Frederick Wenderoth
(74) *Attorney, Agent, or Firm* — Lempia Summerfield Katz LLC

(57) ABSTRACT

A method for adapting a magnetic resonance sequence, a magnetic resonance apparatus and a computer program product are provided. According to the method, a magnetic resonance sequence is provided. The magnetic resonance sequence includes at least one gradient pulse. In addition, at least one item of examination information is provided. The at least one gradient pulse of the magnetic resonance sequence is adapted based on the at least one item of examination information. In this process, a gradient strength of the at least one gradient pulse of the magnetic resonance sequence is adapted, (e.g., reduced), in an adaptation segment in such a way that the gradient strength before and after the adaptation segment is higher, at least in segments, than in the adaptation segment.

14 Claims, 2 Drawing Sheets

(51) Int. Cl.
*G01R 33/385* (2006.01)
*G01R 33/44* (2006.01)

(58) Field of Classification Search
USPC .......................................................... 324/309
See application file for complete search history.

(56) References Cited

FOREIGN PATENT DOCUMENTS

| | | | | |
|---|---|---|---|---|
| DE | 102012219016 B3 | * | 3/2014 | ........... G01R 33/385 |
| DE | 102018213729 A1 | * | 8/2019 | ............. A61B 5/704 |
| EP | 2646843 B1 | * | 8/2020 | ......... G01R 33/3875 |
| WO | WO-2017196878 A1 | * | 11/2017 | ............. A61B 5/055 |

OTHER PUBLICATIONS

Seada, Samy Abo, et al., “Minimum TR radiofrequency-pulse design for rapid gradient echo sequences,” Magnetic Resonance in Medicine, vol. 86, pp. 182-196 (2021).

* cited by examiner

METHOD FOR ADAPTING A MAGNETIC RESONANCE SEQUENCE, MAGNETIC RESONANCE APPARATUS, AND COMPUTER PROGRAM PRODUCT

The present patent document claims the benefit of German Patent Application No. 10 2023 206 857.5, filed Jul. 19, 2023, which is hereby incorporated by reference in its entirety.

TECHNICAL FIELD

The disclosure relates to a method for adapting a magnetic resonance sequence, to a magnetic resonance apparatus, and to a computer program product.

BACKGROUND

In medical technology, high soft-tissue contrasts are a particular feature of imaging using magnetic resonance (MR), also known as magnetic resonance imaging (MRI) or magnetic resonance tomography (MRT). In this process, an object under examination, in particular a patient, is positioned in an examination region of a magnetic resonance apparatus. A main magnet is used to produce a main magnetic field, also known as the B0 field, in the examination region. During a magnetic resonance measurement, radiofrequency (RF) pulses are applied by a radiofrequency antenna unit and gradient pulses are applied by a gradient coil unit, in accordance with a magnetic resonance sequence. The pulses that are produced excite and trigger spatially encoded magnetic resonance signals in the patient. The triggered magnetic resonance signals are received by a receive coil arrangement of the magnetic resonance apparatus and used to reconstruct magnetic resonance images.

SUMMARY AND DESCRIPTION

In order to obtain magnetic resonance images of the highest possible quality, the magnetic resonance sequence may be as well adapted as possible to the examination task and/or the examination conditions. The object of the present disclosure may be considered to be to perform such an adaptation of the magnetic resonance sequence.

The scope of the present disclosure is defined solely by the appended claims and is not affected to any degree by the statements within this summary. The present embodiments may obviate one or more of the drawbacks or limitations in the related art.

A method is proposed for adapting a magnetic resonance sequence for examining an object under examination by a magnetic resonance apparatus. In this method, a (e.g., original) magnetic resonance sequence is provided. The magnetic resonance sequence includes at least one gradient pulse. In addition, at least one item of examination information is provided. The at least one gradient pulse of the magnetic resonance sequence is adapted based on the at least one item of examination information. In this process, a gradient strength of the at least one gradient pulse of the magnetic resonance sequence is adapted, (e.g., reduced), in an adaptation segment in such a way that the gradient strength before and after the adaptation segment is higher, at least in segments, than in the adaptation segment. After the adaptation, the at least one gradient pulse may have a gradient strength, which at the start of the gradient pulse and/or at the end of the gradient pulse is higher than in the adaptation segment. The adaptation segment may lie centrally in the gradient pulse. A magnetic resonance examination of the object under examination is advantageously carried out based on the adapted magnetic resonance sequence.

The providing of a magnetic resonance sequence is performed, for example, by a first provider unit. The providing of a magnetic resonance sequence is performed, for example, by a second provider unit, which may also be identical to the first provider unit. The adapting of the gradient strength of the at least one gradient pulse of the magnetic resonance sequence based on the at least one examination information is performed by an adaptation unit, for example. This may be part of a system control unit of the magnetic resonance apparatus, for instance. The adaptation unit may include a computing unit and/or a memory unit. The computing unit may include one or more processors and/or one or more memory modules.

The magnetic resonance sequence may include a plurality of modules, which include the at least one gradient pulse. In addition, the magnetic resonance sequence may also include RF pulses and/or readout modules as further modules.

A magnetic field gradient is advantageously produced in an examination region of the magnetic resonance apparatus by applying a gradient pulse during execution of the magnetic resonance sequence. A magnetic field gradient may be a change in the magnetic field in a certain direction, e.g., a linear increase or decrease. The magnetic gradient fields may be produced by gradient coils of the magnetic resonance apparatus. The magnetic gradient fields may imprint spatial encoding on the magnetic resonance signals, and, for example, define the spatial resolution in the magnetic resonance image.

A gradient pulse may be described by a time-dependent gradient strength. The gradient strength may rise sharply at the start of the gradient pulse and fall again at the end of the gradient pulse.

The magnetic resonance sequence may provide that at least one RF pulse is applied during the at least one gradient pulse. The magnetic resonance sequence may be a Variable-Rate Selective Excitation (VERSE) sequence. This type of magnetic resonance sequence is described, for example, in the publication Hargreaves, B. A., Cunningham, C. H., Nishimura, D. G., & Conolly, S. M. (2004), "Variable-rate selective excitation for rapid MRI sequences," Magnetic Resonance in Medicine, 52(3), 590-597.

In the most common types of magnetic resonance sequences, the gradient strength is constant during an RF pulse. This is not the case in particular with VERSE pulses, where the gradient strength in the center of the pulse may be lower than at the beginning and end of the pulse. This may be implemented particularly advantageously if free or arbitrary gradient shapes are allowed during the pulse, and the pulse and the gradient shape may be optimized based on boundary conditions, for instance in order to achieve a short duration and/or a low SAR exposure.

It may be helpful here to reduce the gradient strength significantly in the center of the pulse compared with pulses without VERSE. As a result, however, the pulses are far more susceptible to inhomogeneities in the B0 field in the object under examination, for example around air/water interfaces or metal implants.

It may therefore be unclear or difficult to determine whether, or to what extent, the gradient strength may be reduced in the center of the pulse. Furthermore, when the gradient strength is very low, the inhomogeneities in the B0 field that occur outside the center of the magnetic resonance apparatus dominate the field change produced by the gradient pulse. The resultant impaired linearity in the gradient field gives rise to artifacts, which may be reduced advantageously by the proposed adaptation of the at least one gradient pulse of the magnetic resonance sequence based on the at least one item of examination information.

The adapting of the gradient strength of the at least one gradient pulse of the magnetic resonance sequence may include defining a maximum gradient strength reduction factor and/or a minimum gradient strength based on the at least one item of examination information, and adapting the gradient strength of the at least one gradient pulse of the magnetic resonance sequence based on the maximum gradient strength reduction factor and/or a minimum gradient strength.

For example, in the adapting of the gradient strength of the at least one gradient pulse, at least in the adaptation segment, the gradient is reduced by the maximum gradient strength reduction factor. In the adapting of the gradient strength of the at least one gradient pulse, at least in the adaptation segment, the gradient strength is divided by the maximum gradient strength reduction factor. The resultant minimum gradient strength may represent a lower limit, down to which the gradient strength of the at least one gradient pulse is adapted in the adaptation segment.

For example, the maximum gradient strength reduction factor is MGSRF, and the original gradient strength $A_{G,P}$ is reduced in the adapting in the center of the gradient pulse to the resultant gradient strength $A_{G,min}$ according to the following equation: $A_{G,min}=A_{G,P}/MGSRF$. It is also conceivable, however, that $A_{G,min}$ represents only a lower limit for the reduction, and the gradient strength is reduced to a value between $A_{G,P}$ and $A_{G,min}$.

The determined minimum gradient strength advantageously represents a lower (absolute) limit, down to which the gradient strength of the at least one gradient pulse is adapted in the adaptation segment.

The at least one item of examination information may include information about a B0 magnetic field distribution in a region to be measured. A measurement for capturing a B0 map may be carried out for this purpose before the adapting of the gradient strength, for example. The region to be measured may be part of the examination region in which the object under examination is placed for the examination.

The region to be measured may be the region given by a field of view (FOV) of a magnetic resonance measurement, e.g., the FOV of a measured B0 map. This information may be measured directly.

Information about a B0 magnetic field distribution may originate from a B0 map and/or shim information. Advantageously, shim information may be available for a magnetic resonance examination and contain information about phase variations. From this information may be determined advantageously an at least relative B0 map, in which the deviations from the main frequency may be identified. In addition, other calculations or estimates based on the patient's anatomy may also be used.

In the adapting of the gradient strength of the at least one gradient pulse may be calculated advantageously from the information about the B0 magnetic field distribution how strong the effects of any deviations will be on the magnetic resonance image to be produced, and to what limit of gradient strength reduction factor and/or gradient strength these would be acceptable. In addition, for instance in the case of shim information, the maximum gradient strength reduction factor and/or the minimum gradient strength may be defined based on empirical values.

The at least one item of examination information may include information about the examination of an object under examination, in particular about a region to be examined of the object under examination. For example, the examination information includes the part of the body is to be examined, e.g., the head or abdomen of the patient.

If the magnetic resonance examination to be carried out is taking place, for instance, in a region in which mostly no major B0 effects arise (e.g. in the region of the lumbar spine), and/or if the clinical issue is not sensitive to potential B0 effects, a high maximum gradient strength reduction factor and/or a small minimum gradient strength may be chosen. If, however, regions are being measured in which B0 deviations are large (e.g. in the neck, the abdomen, or in the orbital cavity), in the adapting of the at least one gradient pulse, the maximum gradient strength reduction factor may be chosen to be small, or the minimum gradient strength to be large.

The at least one item of examination information may include information about the object under examination, for instance information about a height of the object under examination and/or existence of implants in the object under examination.

For example, if a magnetic resonance examination is taking place in the vicinity of an implant, in the adapting of the at least one gradient pulse, the maximum gradient strength reduction factor may be chosen to be rather small, or the minimum gradient strength to be large.

The at least one item of examination information may include information about the B0 homogeneity of the magnetic resonance apparatus and/or about a coil configuration to be used for the examination.

The information about the B0 homogeneity of the magnetic resonance apparatus may include information about the B0 field distribution in a region that extends beyond the field of view. In particular, this region includes the entire region covered by the radiofrequency antenna unit, in particular by transmit and/or receive coils, of the magnetic resonance apparatus. It is not normally possible to measure this information directly, but it may have an effect on the necessary gradient strength.

For example, if, during the magnetic resonance examination, parts of the body of the patient lie in regions that are outside the center of the magnetic resonance apparatus and in which greater B0 inhomogeneities arise, in the adapting of the at least one gradient pulse, the maximum gradient strength reduction factor may be chosen to be small, or the minimum gradient strength to be large.

In addition, a magnetic resonance apparatus is proposed that is designed to perform an above-described method. The advantages of the proposed magnetic resonance apparatus may be the same as the advantages detailed above of the proposed method for adapting a magnetic resonance sequence. Features, advantages, or alternative embodiments mentioned in this connection may also be applied to the other claimed subject matter, and vice versa.

In addition, a computer program product is proposed, which includes a program and may be loaded directly into a memory of a programmable computing unit of a magnetic resonance apparatus, and has program code, e.g. libraries and auxiliary functions, in order to perform a proposed method for adapting a magnetic resonance sequence for examining an object under examination by a magnetic resonance apparatus when the computer program product is executed in the computing unit of the magnetic resonance apparatus. The computer program product may include software containing a source code, which still needs to be compiled and linked or just needs to be interpreted, or an executable software code, which for execution only needs to be loaded into the computing unit. The method may be performed quickly, reproducibly, and robustly by the computer program product. The computer program product is configured such that it may use the computing unit to perform the method described herein. The computing unit has the necessary specification, (e.g., a suitable RAM, a suitable graphics card, or a suitable logic unit), in order to be able to execute the respective method acts efficiently.

The computer program product may be stored on a computer-readable medium or on a network or server, from where the computer program product may be loaded into the processor of a local computing unit, which processor may be connected directly to the magnetic resonance apparatus or may form part of the magnetic resonance apparatus. In addition, control information of the computer program product may be stored on an electronically readable data storage medium. The control information on the electronically readable data storage medium may be configured such that it performs a method described herein when the data storage medium is used in a computing unit of a magnetic resonance apparatus. Examples of electronic readable data storage media are a DVD, a magnetic tape, or a USB stick, on which is stored electronically readable control information, in particular software. When this control information is read from the data storage medium and stored in a computing unit of the magnetic resonance apparatus, the embodiments of the above-described methods may be performed. Hence, the disclosure may also proceed from the computer-readable medium and/or from the electronically readable data storage medium.

BRIEF DESCRIPTION OF THE DRA WINGS

Further advantages, features, and details of the disclosure appear in the embodiments described below and follow from the drawings. Corresponding parts are denoted by the same reference signs in the figures.

DETAILED DESCRIPTION

Figure 1:
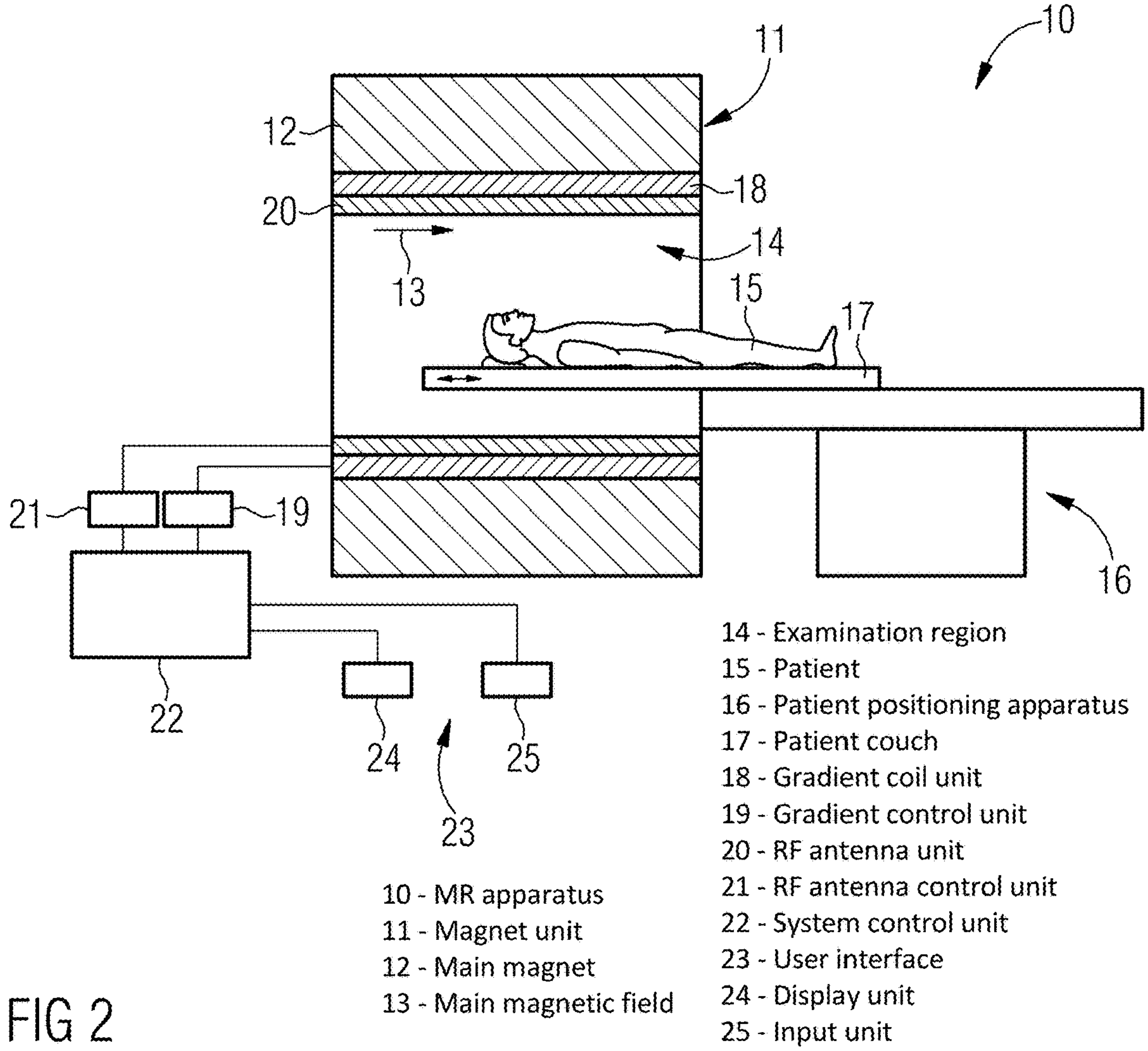
FIG. 1 depicts in a schematic representation an example of a magnetic resonance apparatus.

FIG. 1 shows schematically a magnetic resonance apparatus 10. The magnetic resonance apparatus 10 includes a magnet unit 11, which has a main magnet 12 for producing a powerful main magnetic field 13, which may be constant over time. The magnetic resonance apparatus 10 also includes an examination region 14 for accommodating an object under examination (e.g., a patient 15). In the present embodiment, the examination region 14 is shaped as a cylinder and is enclosed in a circumferential direction cylindrically by the magnet unit 11. In principle, however, the examination region 14 may have a different design. The patient 15 may be moved into the examination region 14 by a patient positioning apparatus 16 of the magnetic resonance apparatus 10. The patient positioning apparatus 16 includes for this purpose a patient couch 17, which is able to move inside the examination region 14.

The magnet unit 11 further includes a gradient coil unit 18 for producing magnetic field gradients, which are used for spatial encoding during imaging. The gradient coil unit 18 is controlled by a gradient control unit 19 of the magnetic resonance apparatus 10. The magnet unit 11 also includes a radiofrequency antenna unit 20, which in the present embodiment is in the form of a body coil that is fixedly integrated in the magnetic resonance apparatus 10. The radiofrequency antenna unit 20 is controlled by a radiofrequency antenna control unit 21 of the magnetic resonance apparatus 10 and radiates radiofrequency magnetic resonance sequences into an examination space, which is formed by an examination region 14 of the magnetic resonance apparatus 10. This results in excitation of atomic nuclei in the main magnetic field 13 produced by the main magnet 12. Magnetic resonance signals are produced by relaxation of the excited atomic nuclei. The radiofrequency antenna unit 20 is designed to receive the magnetic resonance signals.

The magnetic resonance apparatus 10 has a system control unit 22 for controlling the main magnet 12, the gradient control unit 19, and the radiofrequency-antenna control unit 21. The system control unit 22 centrally controls the magnetic resonance apparatus 10, for instance the implementation of a magnetic resonance sequence, in particular a VERSE sequence. Such a magnetic resonance sequence may include a plurality of modules, (e.g., RF pulses), which are produced by the radiofrequency antenna unit 20 during implementation of the magnetic resonance sequence, and gradient pulses, which are produced by the gradient coil unit 18.

In addition, the system control unit 22 includes an analysis unit (not presented in further detail) for analyzing the magnetic resonance signals acquired during the magnetic resonance examination. In addition, the magnetic resonance apparatus 10 includes a user interface 23, which is connected to the system control unit 22. Control information such as imaging parameters, for instance, and reconstructed magnetic resonance images may be displayed to a medical operator on a display unit 24, (e.g., on at least one monitor), of the user interface 23. In addition, the user interface 23 has an input unit 25, which may be used by the medical operator to enter information, (e.g., examination information), and/or parameters during a measurement procedure.

Figure 2:
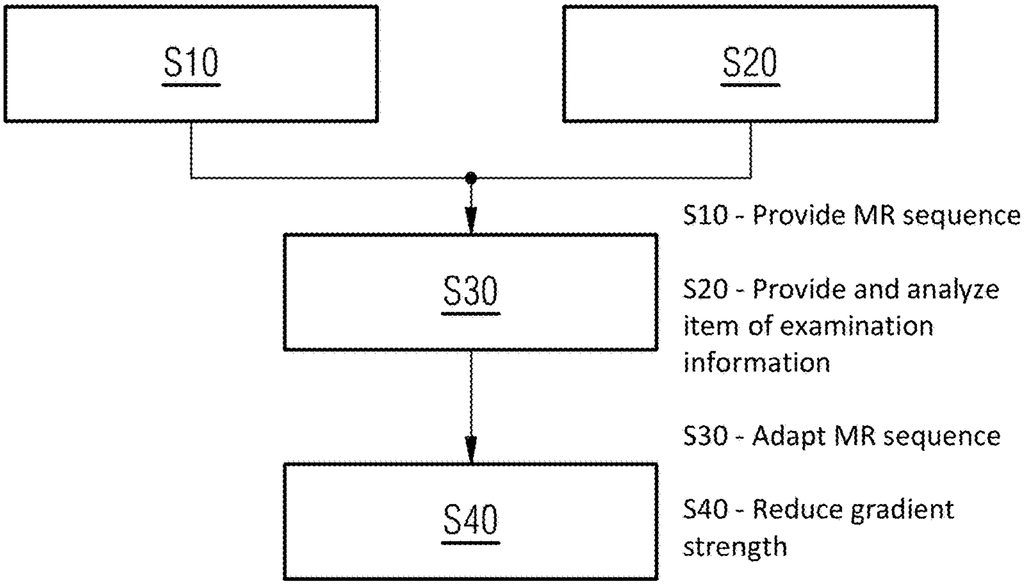
FIG. 2 depicts an example of a flow diagram of a method for adapting a magnetic resonance sequence.

FIG. 2 shows a possible flow of a method for adapting a magnetic resonance sequence for examining the patient 15 by the magnetic resonance apparatus 10.

In act S10 of the method, a magnetic resonance sequence including at least one gradient pulse is provided. This may be selected by the operator via the input unit 25, for example, and provided to the system control unit 22.

In act S20, at least one item of examination information is provided and analyzed. The at least one item of examination information is available advance information, for example. This may include at least one of the following aspects.

In one example, the at least one item of examination information includes information about the B0 distribution in the region to be measured. This may originate from B0 maps, shim information or the like. Shim information in particular is normally available for a magnetic resonance examination and contains information about the phase variations. The B0 maps and/or shim information may be measured in particular in any preceding acts.

In another example, the at least one item of examination information includes information about the planned examination and the body region to be examined of the patient 15.

In another example, the at least one item of examination information includes information about the patient 15, for instance height, implants, etc.

In another example, the at least one item of examination information includes information about the B0 homogeneity of the magnetic resonance apparatus 10 used and the coil configuration used.

In act S30, the magnetic resonance sequence is adapted. In this process, a gradient strength of the at least one gradient pulse of the magnetic resonance sequence is adapted in an adaptation segment based on the at least one item of examination information provided in act S20. After the adapting, the gradient strength before and/or after the adaptation segment is higher, at least in segments, than in the adaptation segment.

Figure 3:
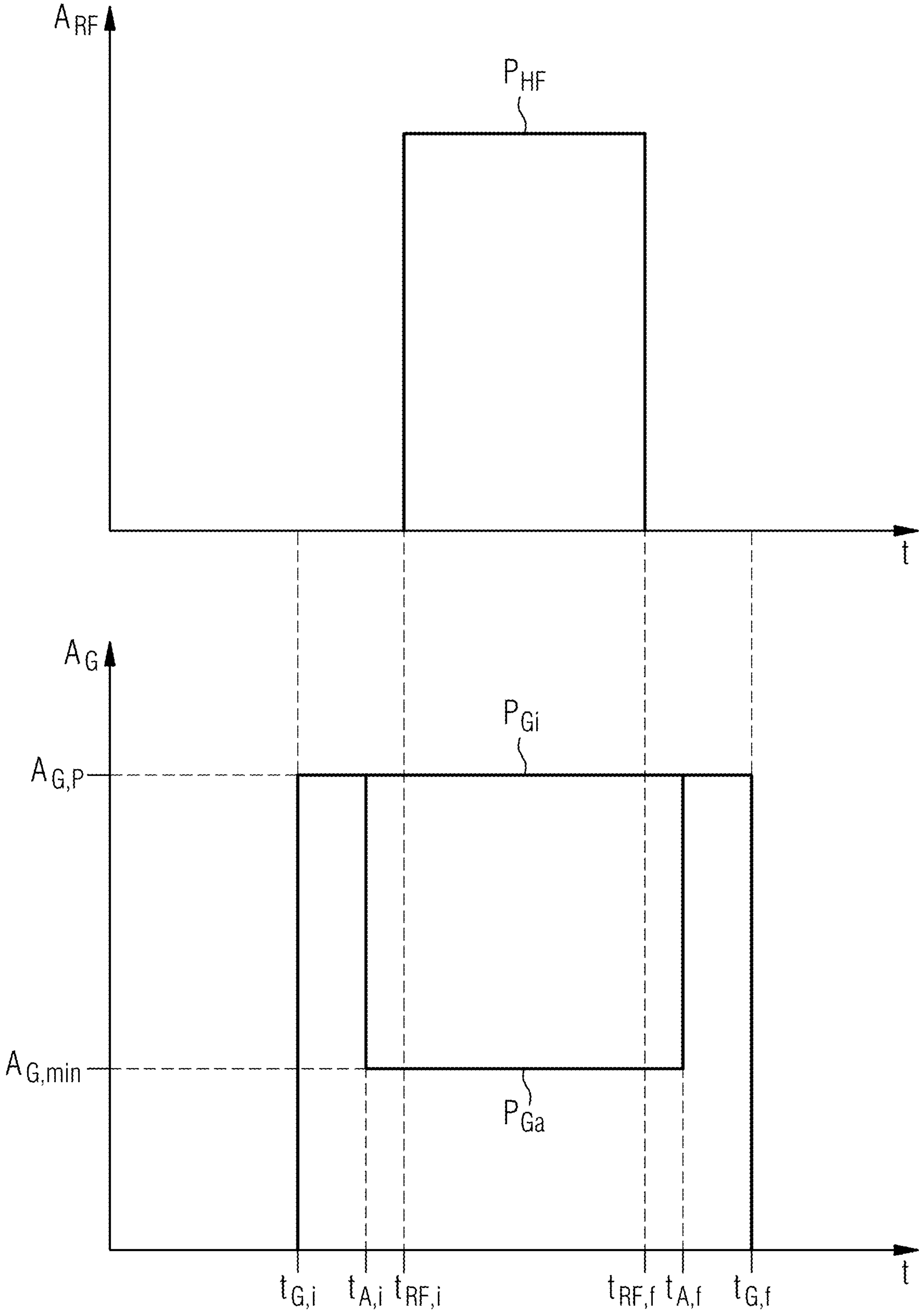
FIG. 3 depicts examples of gradient pulses before and after adaptation.

This shall be illustrated with the aid of FIG. 3. The top graph here shows a possible variation in an amplitude $A_{RF}$ of an RF pulse $P_{HF}$ as a function of time t. The RF pulse $P_{HF}$ starts at time $t_{RF,i}$ and ends at time $t_{RF,f}$. A gradient pulse is also applied while the RF pulse $P_{HF}$ is being applied. The original gradient pulse $P_{Gi}$, (i.e., the gradient pulse that has not yet been adapted), is rectangular, e.g., at time $t_{G,i}$ the gradient strength rises to a value $A_{G,P}$, then remains constant up to a time $t_{G,i}$, and then falls again. In particular, the pulse edges are shown only schematically in FIG. 3. In reality, the pulses have certain rise times and fall times.

In act S40, as a result of the adapting in act S30 based on the at least one item of examination information provided in act S20, the gradient strength is reduced in an adaptation segment between the times $t_{A,i}$ and $t_{A,f}$ to a value $A_{G,min}$. The resultant gradient pulse $P_{Ga}$ thereby has a higher gradient strength, in segments, before and after the adaptation segment, namely in the segment between the times $t_{G,i}$ and $t_{A,i}$ before the adaptation segment, and in the segment between $T_{A,f}$ and $t_{G,f}$ after the adaptation segment.

The pulses $P_{HF}$ and $P_{Ga}$ correspond schematically also to an excitation based on a VERSE magnetic resonance sequence. The radiofrequency pulse $P_{HF}$ may be applied during the gradient pulse $P_{Ga}$.

Based on the information obtained in act S20, the following aspects, for example, may be taken into account in act S30.

For example, from the B0 information, how strong the effects of any deviations will be on the planned image may be calculated, and to what level of factor these would be acceptable. In addition, for instance in the case of shim information, a factor may be defined based on empirical values.

In another example, if the examination is taking place in a region in which mostly no major B0 effects arise (e.g. lumbar spine), or if the clinical issue is not sensitive to potential B0 effects, the factor may be chosen to be large. If, however, regions are being measured in which B0 deviations are large, for instance in the neck, the abdomen, or in the orbital cavity, the factor may be chosen to be small.

In another example, if an examination is taking place in the vicinity of an implant, for example, the factor may likewise be chosen to be small.

In another example, if parts of the body of the patient 15 lie in regions outside the center of the examination region 14, in particular outside the field of view, in which greater B0 inhomogeneities may arise, the factor may be chosen to be small.

Finally, the methods described in detail above and the presented magnetic resonance apparatus are merely embodiments, which may be modified by a person skilled in the art in many ways without departing from the scope of the disclosure. In addition, the use of the indefinite article "a" or "an" does not rule out the possibility of there also being more than one of the features concerned. Likewise, the term "unit" does not exclude the possibility that the components in question include a plurality of interacting sub-components, which may also be spatially distributed if applicable.

It is to be understood that the elements and features recited in the appended claims may be combined in different ways to produce new claims that likewise fall within the scope of the present disclosure. Thus, whereas the dependent claims appended below depend on only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for adapting a magnetic resonance sequence for examining an object under examination by a magnetic resonance apparatus, the method comprising:

providing a magnetic resonance sequence having at least one gradient pulse;

providing at least one item of examination information; and adapting an amplitude of a gradient strength of the at least one gradient pulse of the magnetic resonance sequence in an adaptation segment based on the at least one item of examination information, wherein the adapting comprises reducing the amplitude of the gradient strength of the at least one gradient pulse in the adaptation segment such that the amplitude of the gradient strength before and after the adaptation segment is higher, at least in segments, than within the adaptation segment.

2. A magnetic resonance apparatus comprising:

a system control unit comprising a processor configured to:

provide a magnetic resonance sequence having at least one gradient pulse;

provide at least one item of examination information; and adapt an amplitude of a gradient strength of the at least one gradient pulse of the magnetic resonance sequence in an adaptation segment based on the at least one item of examination information, wherein the adaptation comprises reducing the amplitude of the gradient strength of the at least one gradient pulse in the adaptation segment such that the amplitude of the gradient strength before and after the adaptation segment is higher, at least in segments, than within the adaptation segment.

3. A non-transitory computer-readable medium comprising a computer program product, which comprises a program and may be loaded directly into a memory of a programmable system control unit of a magnetic resonance apparatus, wherein the program, when executed in the system control unit of the magnetic resonance apparatus, is configured to:

provide a magnetic resonance sequence having at least one gradient pulse;

provide at least one item of examination information; and adapt an amplitude of a gradient strength of the at least one gradient pulse of the magnetic resonance sequence in an adaptation segment based on the at least one item of examination information, wherein the adaptation comprises reducing the amplitude of the gradient strength of the at least one gradient pulse in the adaptation segment such that the amplitude of the gradient strength before and after the adaptation segment is higher, at least in segments, than within the adaptation segment.

4. The method of claim 1, further comprising:

carrying out a magnetic resonance examination based on the adapted magnetic resonance sequence.

5. The method of claim 1, wherein the adapting of the amplitude of the gradient strength of the at least one gradient pulse of the magnetic resonance sequence comprises:

determining a maximum gradient strength reduction factor and/or a minimum gradient strength based on the at least one item of examination information; and adapting the amplitude of the gradient strength in the adaptation segment based on the maximum gradient strength reduction factor and/or the minimum gradient strength.

6. The method of claim 1, wherein the at least one item of examination information comprises information about a B0 magnetic field distribution in a region to be measured.

7. The method of claim 1, wherein the at least one item of examination information comprises information about the examination of the object under examination.

8. The method of claim 1, wherein the at least one item of examination information comprises information about the object under examination.

9. The method of claim 1, wherein the at least one item of examination information comprises information about a B0 homogeneity of the magnetic resonance apparatus, a coil configuration to be used for the examination, or a combination thereof.

10. The method of claim 1, wherein the magnetic resonance sequence provides that at least one radiofrequency pulse is applied during the at least one gradient pulse.

11. The method of claim 1, wherein the magnetic resonance sequence is a Variable-Rate Selective Excitation (VERSE) sequence.

12. The method of claim 4, wherein the magnetic resonance examination comprises a magnetic resonance measurement.

13. The method of claim 7, wherein the information comprises information about a region to be examined of the object under examination.

14. The method of claim 8, wherein the information comprising a height of the object under examination, an existence of implants in the object under examination, or a combination thereof.

* * * * *